(12) United States Patent
Sumita et al.

(10) Patent No.: US 6,733,902 B2
(45) Date of Patent: May 11, 2004

(54) LIQUID EPOXY RESIN COMPOSITION AND SEMICONDUCTOR DEVICE

(75) Inventors: Kazuaki Sumita, Gunma-ken (JP); Tatsuya Kanamaru, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/218,625

(22) Filed: Aug. 15, 2002

(65) Prior Publication Data

US 2003/0069349 A1 Apr. 10, 2003

(30) Foreign Application Priority Data

Aug. 16, 2001 (JP) ........................................ 2001-247314

(51) Int. Cl.$^7$ ............................................... H01L 29/12

(52) U.S. Cl. ........................ 428/620; 257/787; 257/788; 257/791; 257/793; 428/413; 523/466

(58) Field of Search ................................. 257/787, 788, 257/791, 793; 523/466; 428/620, 413; 528/27

(56) References Cited

U.S. PATENT DOCUMENTS 5,053,445 A * 10/1991 Itoh
5,248,710 A * 9/1993 Shiobara .................... 523/435

FOREIGN PATENT DOCUMENTS

| JP | 4-351630 A | 12/1992 |
| JP | 2001-288340 A | 10/2001 |

* cited by examiner

*Primary Examiner*—Robert Dawson
*Assistant Examiner*—David E Aylward
(74) *Attorney, Agent, or Firm*—Birch, Stewart, Kolasch & Birch, LLP

(57) ABSTRACT

A liquid epoxy resin composition includes (A) a liquid epoxy resin, (B) a curing agent, (C) a curing accelerator, (D) an inorganic filler, and (E) a silicone-modified resin resulting from addition reaction of an alkenyl-containing epoxy or phenolic resin with an organopolysiloxane, the liquid epoxy resin composition curing into a product having a Tg of 30–120° C. and a specific dynamic viscoelasticity behavior. The composition is adherent to silicon chips, the cured product is highly resistant to heat and thermal shocks, and the composition is useful as sealant for flip chip type semiconductor devices.

11 Claims, 1 Drawing Sheet

LIQUID EPOXY RESIN COMPOSITION AND SEMICONDUCTOR DEVICE

This invention relates to a liquid epoxy resin composition which causes minimal warpage, has improved adhesion to the surface of silicon chips and especially photosensitive polyimide resins and nitride films, and stability against thermal shocks and is thus suitable as a sealant. It also relates to a semiconductor device which is sealed with the liquid epoxy resin composition.

BACKGROUND OF THE INVENTION

The trend toward smaller sizes, lighter weights and increased capabilities in electrical equipment has led to a shift in the dominant semiconductor mounting process from pin insertion to surface mounting. Progress of semiconductor devices toward a higher degree of integration entails the enlargement of dies having a size as large as 10 mm or more per side. Also an increased number of pins per package has brought on a ball grid array (BGA) in which the substrate has a size as large as 30 mm or more per side. When a semiconductor device using such a large size die or substrate is encapsulated with a sealant, residual stresses left after the cure of the sealant cause the package to warp, which impedes close bonding of balls upon mounting.

For semiconductor devices using such large size dies, greater stresses are applied to the die and the sealant during solder reflow. Such stresses are problematic because separation occurs at the interface between the sealant and the die or substrate, the package cracks upon substrate mounting, and delamination and cracking occur after a thermal cycling test, leading to electrical failure.

SUMMARY OF THE INVENTION

An object of the invention is to provide a liquid epoxy resin composition serving as a sealant which is successful in reducing internal stresses after curing and causing only minimal warpage, and which ensures reliability in that it is well adherent to the surface of silicon chips and especially photosensitive polyimide resins and nitride films, does not deteriorate under hot humid conditions as encountered in PCT (120° C./2.1 atm), and does not peel or crack over several hundred cycles of thermal cycling between −65° C. and 150° C. Another object of the invention is to provide a semiconductor device which is sealed with the cured product of the liquid epoxy resin composition.

It has been found that when a liquid epoxy resin composition comprising (A) a liquid epoxy resin, (B) an curing agent, (C) a curing accelerator, (D) an inorganic filler, and (E) a silicone-modified resin in the form of a copolymer of an epoxy or phenolic resin with an organopolysiloxane cures into a product having a specific Tg and a specific dynamic viscoelasticity behavior, the cured product is effectively adherent to the surface of silicon chips and especially photosensitive polyimide resins and nitride films and is fully resistant to heat and thermal shocks. Due to reduced internal stresses in the cured product, the semiconductor device encapsulated therewith experiences minimal warpage. Then the composition is suited as a sealant for large die or substrate size semiconductor devices.

The present invention provides a liquid epoxy resin composition comprising (A) a liquid epoxy resin, (B) a curing agent, (C) a curing accelerator, (D) an inorganic filler, and (E) a silicone-modified resin. The silicone-modified resin (E) is a copolymer of an alkenyl-containing epoxy resin or alkenyl-containing phenolic resin with an organopolysiloxane of the following average compositional formula (1):

$$H_a R_b SiO_{(4-a-b)/2} \quad (1)$$

wherein R is a substituted or unsubstituted monovalent hydrocarbon group, "a" is a number of 0.01 to 0.1, "b" is a number of 1.8 to 2.2, and a+b is from 1.81 to 2.3, having 20 to 400 silicon atoms per molecule, the number of hydrogen atoms directly bonded to silicon atoms (SiH groups) being 1 to 5, the copolymer resulting from addition reaction of alkenyl groups on the epoxy or phenolic resin with SiH groups on the organopolysiloxane. When the liquid epoxy resin composition is cured, the cured product should have a glass transition temperature (Tg) of 30 to 120° C. and a ratio of a dynamic viscoelasticity at 30° C. or lower to a dynamic viscoelasticity at 150° C. or higher of at least 100.

The invention also provides a semiconductor device which is sealed with the liquid epoxy resin composition in the cured state.

Figure 1:
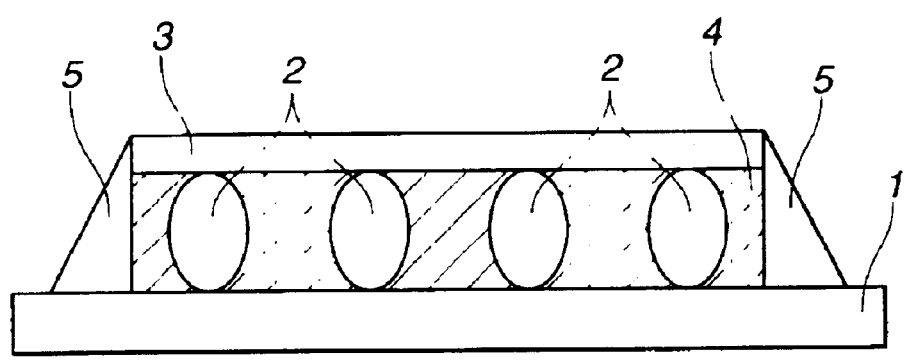
FIG. 1 is a schematic view of a flip chip-type semiconductor device according to one embodiment of the invention.

DESCRIPTION OF THE PREFERRED EMBODIMENTS (A) Liquid Epoxy Resin

Component (A) in the liquid epoxy resin composition of the invention is a liquid epoxy resin that is not critical with respect to molecular structure or molecular weight so long as it has at least two epoxy groups per molecule. Illustrative examples include bisphenol-type epoxy resins such as bisphenol A epoxy resin and bisphenol F epoxy resin, novolac-type epoxy resins such as phenolic novolac epoxy resin and cresol novolac epoxy resin, naphthalene-type epoxy resins, biphenyl-type epoxy resins and cyclopentadiene-type epoxy resins. These epoxy resins may be used singly or as mixtures of two or more thereof. Among others, epoxy resins which are liquid at room temperature (e.g., 25° C.) are preferred.

The epoxy resin used herein may include epoxy resins of the following structures as long as such addition does not adversely affect penetrability of the sealant.

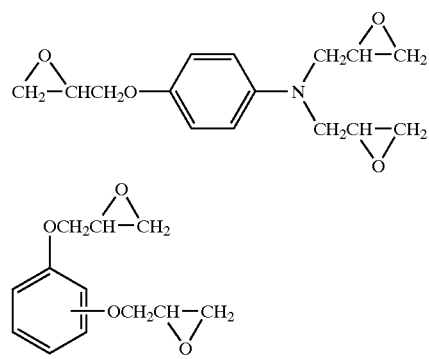

Preferably, an epoxy resin of the following general formula (2) is included.

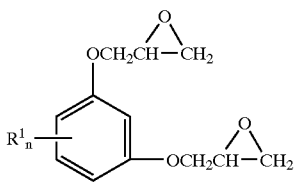

(2)

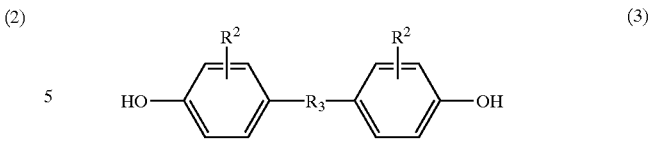

(3)

Herein $R^1$ is hydrogen or a monovalent hydrocarbon group of 1 to 20 carbon atoms, preferably 1 to 10 carbon atoms, more preferably 1 to 3 carbon atoms, for example, alkyl groups such as methyl, ethyl and propyl, and alkenyl groups such as vinyl and allyl. The subscript n is an integer of 1 to 4, and especially equal to 1 or 2.

It is recommended that the epoxy resin of formula (2) be contained in an amount of 25 to 100% by weight, preferably 50 to 100% by weight, more preferably 75 to 100% by weight of the entire epoxy resins. With less than 25% by weight of the epoxy resin of formula (2), the resulting composition may have an increased viscosity or the cured product become less resistant to heat. The epoxy resin of formula (2) is commercially available, for example, under the trade name of MRGE from Nippon Kayaku Co., Ltd.

The liquid epoxy resin preferably has a total chlorine content of not more than 1,500 ppm, and especially not more than 1,000 ppm. When chlorine is extracted from the epoxy resin with water at an epoxy resin concentration of 50% and a temperature of 100° C. over a period of 20 hours, the water-extracted chlorine content is preferably not more than 10 ppm. At a total chlorine content of more that 1,500 ppm or a water-extracted chlorine level of more than 10 ppm, the reliability of the sealed semiconductor device, particularly in the presence of moisture, may be compromised.

(B) Curing Agent

In the liquid epoxy resin composition of the invention, a curing agent is added for causing the liquid epoxy resin to cure.

The curing agent used herein is not critical as long as it can induce curing of the epoxy resin. Any of curing agents used in conventional curable epoxy resin compositions may be used. Exemplary curing agents are compounds having at least two functional groups capable of reacting with the epoxy groups on the epoxy resin, e.g., phenolic hydroxyl groups, amino groups, and acid anhydride groups (at least one acid anhydride group). Any known curing agent may be employed without particular limitation with respect to molecular structure and molecular weight. Among others, phenolic curing agents are preferred.

Illustrative examples of suitable phenolic resins having at least two phenolic hydroxyl groups per molecule include novolac-type phenolic resins such as phenolic novolac resin and cresol novolac resin, xylylene-modified novolac resins such as p-xylylene-modified novolac resin, m-xylylene-modified novolac resin and o-xylylene-modified novolac resin, bisphenol-type phenolic resins such as bisphenol A resin and bisphenol F resin, biphenyl-type phenolic resins, resol-type phenolic resins, phenol aralkyl-type resins, biphenyl aralkyl-type resins, triphenolalkane-type resins such as triphenolmethane resin and triphenolpropane resin, and phenolic resins which are polymers of any of the above; as well as naphthalene ring-containing phenolic resins and dicyclopentadiene-modified phenolic resins.

In the curing agent used herein, a phenolic curing agent having the following general formula (3) is preferably included.

Herein $R^2$ is a monovalent hydrocarbon group of up to 10 carbon atoms, preferably 2 to 10 carbon atoms, having a double bond, for example, alkenyl groups such as vinyl, allyl and hexenyl. $R^3$ is selected from divalent hydrocarbon groups of the following formulae:

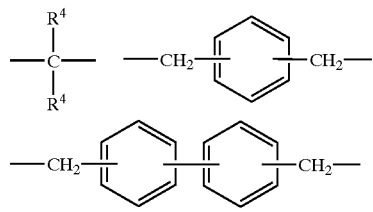

wherein $R^4$ is hydrogen or a monovalent hydrocarbon group of up to 10 carbon atoms, preferably 1 to 5 carbon atoms, for example, alkyl groups such as methyl and ethyl.

It is recommended that the phenolic curing agent of formula (3) be contained in an amount of 25 to 100% by weight, preferably 50 to 100% by weight, more preferably 75 to 100% by weight of the entire curing agent. With less than 25% by weight of the agent of formula (3), the resulting composition may have an increased viscosity to impede operation, an increased elasticity at 150° C. or higher, or increased internal stresses after curing which can cause warpage.

The phenolic curing agent of formula (3) should preferably have a viscosity of up to 300 Pa·s, especially up to 100 Pa·s at 25° C. If the curing agent has a viscosity of more than 300 Pa·s, the resulting composition may also has too high a viscosity to work.

Typical phenolic curing agent is an allyl-containing phenolic resin which is commercially available, for example, under the trade name of DAL-BPA from Honshu Chemical Industry Co., Ltd.

A phenolic curing agent of formula (3) wherein $R^2$ is hydrogen or a double bond-free monovalent hydrocarbon group of up to 10 carbon atoms, preferably 1 to 5 carbon atoms, typically alkyl, which is solid at room temperature may be used in combination with the above curing agent as long as the benefits of the invention are not impaired. Such an additional curing agent is available, for example, as DL series from Meiwa Chemicals Co., Ltd. Since the additional curing agent is solid at room temperature, it is desired to mix the additional curing agent with the phenolic curing agent of formula (3) in such amounts that the mixture is liquid at room temperature. The mixing technique is not critical although melt mixing at 120° C. is desirable.

The amount of the curing agent (B) added is suitably determined as long as it is effective to cure the epoxy resin (A). In the case of a phenolic curing agent, the desired amount is such that 0.7 to 1.3 moles, especially 0.8 to 1.2 moles of phenolic hydroxyl groups are available per mole of epoxy groups in the liquid epoxy resin (A).

(C) Curing Accelerator

In the inventive composition, the curing accelerator (C) is blended for the purpose of curing the liquid epoxy resin (A) or accelerating curing reaction of the liquid epoxy resin (A) with the curing agent (B). The curing accelerator is not critical as long as it can accelerate curing reaction. A curing accelerator comprising one or more cure accelerating catalysts selected from among imidazole compounds and organophosphorus compounds is preferred.

The imidazole compounds that may be used include those of the following general formula (4).

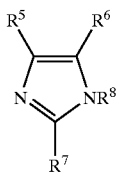

(4)

In the formula (4), $R^5$ and $R^6$ are independently selected from among hydrogen, methyl, ethyl, hydroxymethyl and phenyl; $R^7$ is selected from among methyl, ethyl, pentadecyl, undecyl, phenyl and allyl; and $R^8$ is selected from among hydrogen, methyl, ethyl, cyanoethyl, benzyl and a group of formula (5) below.

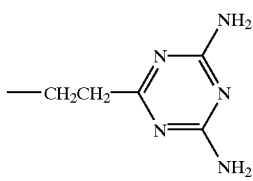

(5)

Examples of suitable imidazole compounds include 2-methylimidazole, 2-ethylimidazole, 1,2-dimethylimidazole, 2,4-dimethylimidazole, 1,2-diethylimidazole, 2-ethyl-4-methylimidazole, 2-heptadecylimidazole, 2-undecylimidazole, 2-phenylimidazole, 1-benzyl-2-methylimidazole, 1-benzyl-2-phenylimidazole, 1-cyanoethyl-2-methylimidazole, 1-cyanoethyl-2-undecylimidazole, 2,4-diamino-6-[2'-methylimidazolyl-(1)']-ethyl-S-triazine, 2,4-diamino-6-[2'-ethyl-4'-methylimidazolyl-(1)']-ethyl-S-triazine, 2,4-diamino-6-[2'-undecylimidazolyl]-ethyl-S-triazine, the isocyanuric acid addition product of 2,4-diamino-6-[2'-methylimidazolyl-(1)']-ethyl-S-triazine, 2-phenyl-4-methyl-5-hydroxymethylimidazole, 2-phenyl-4,5-dihydroxymethyl-imidazole, and 2-aryl-4,5-diphenylimidazoles.

Suitable organophosphorus compounds include triorganophosphines such as triphenylphosphine, tributylphosphine, tri(p-methylphenyl)phosphine, tri(nonylphenyl)phosphine and diphenyltolylphoshine; the salt of a triorganophosphine with a triorganoborane such as the salt of triphenylphosphine with triphenylborane; tetraorganophosphoniums such as tetraphenylphosphonium; and the salt of a tetraorganophosphonium with a tetraorganoborate such as the salt of tetraphenylphosphonium with tetraphenylborate. Of these, organophosphine compounds of general formula (6) below are preferred.

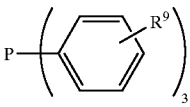

(6)

In formula (6), $R^9$ is a hydrogen atom or an alkyl or alkoxy group of 1 to 4 carbon atoms. Examples of suitable alkyl groups include methyl, ethyl, propyl, isopropyl, butyl, isobutyl and tert-butyl. Examples of suitable alkoxy groups include methoxy and ethoxy. $R^9$ is preferably hydrogen or methyl.

The curing accelerator may be blended as such, but preferably in microcapsule form, typically in the form of microcapsules containing the curing accelerator therein and having an average particle size of 0.5 to 10 μm.

The microcapsules employed in the invention use as the shell material a polymer composed of (meth)acrylic monomers such as $C_{1-8}$ alkyl esters of acrylic acid, itaconic acid, methacrylic acid or crotonic acid, or $C_{1-8}$ alkyl esters of the same type in which some or all of the hydrogen atoms on the alkyl group are substituted with allyl groups or the like; monofunctional monomers such as styrene, α-methylstyrene, acrylonitrile, methacrylonitrile or vinyl acetate; and polyfunctional monomers such as ethylene glycol (meth)acrylate, polyethylene glycol di(meth)acrylate, divinylbenzene, bisphenol A di(meth)acrylate and methylenebis(meth)acrylamide. The imidazole compound and/or organophosphorus compound serving as the curing accelerator or cure accelerating catalyst is enclosed within the polymer shell. Of the above polymers, polymers of (meth)acrylic monomers are preferred.

A variety of methods may be used to produce the microencapsulated curing accelerator. The use of a method known to the art, such as suspension polymerization or emulsion polymerization, is advantageous for the efficient production of microcapsules of good sphericity.

To obtain a high-concentration microencapsulated curing accelerator using a cure accelerating catalyst of customary molecular structure, the above-described monomer is used in an overall amount of preferably about 10 to 200 parts by weight, more preferably 10 to 100 parts by weight, and most preferably 20 to 50 parts by weight, per 10 parts by weight of the cure accelerating catalyst. Less than 10 parts by weight of the monomer may be difficult for the microcapsule to impart sufficient latency to the cure accelerating catalyst. On the other hand, the use of more than 200 parts by weight of the monomer lowers the proportion of catalyst, which may make it necessary to use a large amount of microencapsulated catalyst to achieve sufficient curability and can therefore be economically undesirable.

The microcapsules produced by the foregoing process preferably have an average particle size of 0.5 to 10 μm, more preferably an average particle size of 0.5 to 10 μm and a maximum particle size of not more than 50 μm, and most preferably an average particle size of 2 to 5 μm and a maximum particle size of not more than 20 μm. Microcapsules with an average particle size of less than 0.5 μm have too large a specific surface area so that the incorporation of such microcapsules in the composition may increase the viscosity thereof. On the other hand, microcapsules with an average particle size greater than 10 μm may be dispersed in the resin component non-uniformly, leading to a decline in the reliability.

The microencapsulated catalyst used herein preferably has a performance such that, when 1 g of the curing catalyst-containing microcapsules is measured out and mixed into 30 g of o-cresol, the mixture is left to stand at 30° C. for 15 minutes, and the amount of catalyst that has dissolved out of the microcapsules is determined by gas chromatography or the like, catalyst dissolution from the microcapsules into o-cresol corresponds to at least 70 wt %, more preferably at least 75 wt % of the total amount of catalyst in the microcapsules. At a dissolution of less than 70 wt %, a longer curing time may become necessary, leading to a drop of productivity. The upper limit of the dissolution may be suitably determined depending on the curing situation. A dissolution of up to 95 wt % is often preferred in order that the microcapsules contribute to the latency of cure accelerating catalyst.

The curing accelerator, when an imidazole or organophosphorus compound is used without encapsulation, is preferably included within the inventive composition in an amount of from 0.1 to 15 parts by weight, and more preferably 0.5 to 7 parts by weight, per 100 parts by weight of the liquid epoxy resin (A). Less than 0.1 part by weight of the curing accelerator may be less effective for curing. More than 15 parts by weight of the curing accelerator provides excellent cure, but tends to invite an undesirable loss in shelf stability. The microencapsulated curing accelerator is preferably included in such an amount that 1 to 15 parts, and more preferably 2 to 10 parts by weight of the cure accelerating catalyst is available from the microcapsules per 100 parts by weight of the liquid epoxy resin (A). Less than 1 part by weight may be less effective for curing whereas more than 15 parts by weight may provide excellent cure at the sacrifice of shelf stability.

The microencapsulated curing accelerator may be used in admixture with the non-microencapsulated curing accelerator. In this embodiment, the amount of the curing accelerator within microcapsules and the non-microencapsulated curing accelerator combined is preferably 1 to 15 parts, especially 2 to 7 parts by weight per 100 parts by weight of the liquid epoxy resin (A). Less than 1 part by weight may be less effective for curing whereas more than 15 parts by weight may provide excellent cure at the sacrifice of shelf stability.

(D) Inorganic Filler

Any inorganic filler known to be useful for lowering the expansion coefficient is included in the inventive composition. Specific examples include fused silica, crystalline silica, aluminum, alumina, aluminum nitride, boron nitride, silicon nitride, magnesia and magnesium silicate. Of these, spherical fused silica is desirable for achieving low viscosity.

When the liquid epoxy resin composition is used as a potting material, the inorganic filler desirably has an average particle size of 2 to 25 μm and a maximum particle size of preferably up to 75 μm, more preferably up to 50 μm. A filler with an average particle size of less than 2 μm may provide an increased viscosity and cannot be loaded in large amounts. An average particle size of more than 25 μm means the inclusion of a more proportion of coarse particles which will catch on lead wires, causing voids. It is noted that the average particle size and maximum particle size may be obtained by particle size distribution measurement involving laser diffraction analysis. The average particle size may be suitably determined as the weight average value, or median diameter.

The amount of the filler included in the composition is in a range of preferably 100 to 600 parts, especially 200 to 500 parts by weight per 100 parts by weight of the entire organic resin components (i.e., liquid epoxy resin (A), curing agent (B) and modified silicone resin (E) combined).

When the liquid epoxy resin composition is used as an underfill which should exhibit both improved penetration and a lower linear expansion, it is advantageous to include a filler having an average particle size at most about one-tenth as large and a maximum particle size at most one-half as large as the size of the flip chip gap (between the substrate and semiconductor chip in a flip chip semiconductor device). The amount of such filler included in the composition is in a range of preferably 50 to 400 parts by weight, and especially 100 to 250 parts by weight, per 100 parts by weight of the entire organic resin components (i.e., liquid epoxy resin (A), curing agent (B) and modified silicone resin (E) combined). A composition with less than 50 parts by weight of the filler may have too large an expansion coefficient and crack in a thermal cycling test. A composition with more than 400 parts by weight of the filler may have an increased viscosity, which may bring about a decline in thin-film penetration.

(E) Silicone-Modified Resin

In the inventive composition, a silicone-modified resin in the form of a copolymer of an alkenyl-containing epoxy resin or alkenyl-containing phenolic resin with an organopolysiloxane of the following average compositional formula (1) is included.

$$H_a R_b SiO_{(4-a-b)/2} \quad (1)$$

Herein R is a substituted or unsubstituted monovalent hydrocarbon group, "a" is a number of 0.01 to 0.1, "b" is a number of 1.8 to 2.2, and a+b is from 1.81 to 2.3. The organopolysiloxane has 20 to 400 silicon atoms per molecule, and the number of hydrogen atoms directly bonded to silicon atoms (SiH groups) is 1 to 5, preferably 2 to 4, most preferably 2. The copolymer is obtained by addition reaction of alkenyl groups on the epoxy or phenolic resin with SiH groups on the organopolysiloxane.

The monovalent hydrocarbon groups represented by R are preferably those of 1 to 10 carbon atoms, especially 1 to 8 carbon atoms. Examples include alkyl groups such as methyl, ethyl, propyl, isopropyl, butyl, isobutyl, tert-butyl, hexyl, octyl and decyl, alkenyl groups such as vinyl, allyl, propenyl, butenyl and hexenyl, aryl groups such as phenyl, xylyl and tolyl, aralkyl groups such as benzyl, phenylethyl and phenylpropyl, and halo-substituted monovalent hydrocarbon groups, for example, the foregoing groups in which some or all of the hydrogen atoms are substituted with halogen atoms, typically chloro, fluoro and bromo, such as chloromethyl, bromoethyl and trifluoropropyl.

Desirably the copolymer has a structure of the general formula shown below.

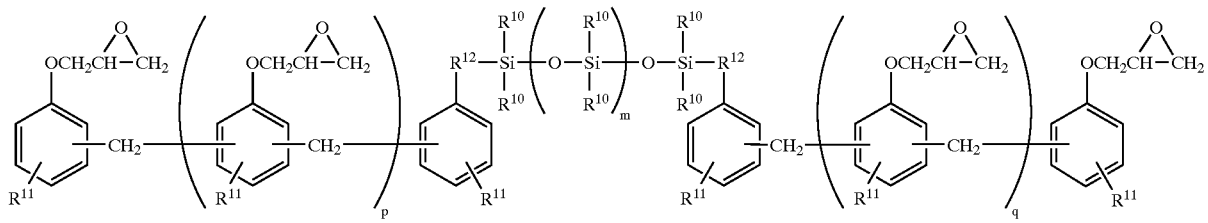

Herein $R^{10}$ is as defined for R, $R^{11}$ is an alkyl group of 1 to 4 carbon atoms, $R^{12}$ is —CH$_2$CH$_2$CH$_2$—, —OCH$_2$—CH(OH)—CH$_2$—O—CH$_2$CH$_2$CH$_2$—, or —O—CH$_2$CH$_2$CH$_2$—, m is an integer of 4 to 199, p is an integer of 1 to 10, and q is an integer of 1 to 10.

Preferably, $R^{10}$ is an unsubstituted or halo-substituted monovalent hydrocarbon group having 1 to 10 carbon atoms, more preferably 1 to 8 carbon atoms. Illustrative examples of $R^{10}$ are the same as enumerated for R. Also, m is preferably an integer of 19 to 99.

The silicone-modified resin is preferably used in such an amount that 1 to 20 parts, especially 2 to 15 parts by weight of diorganosiloxane units is available from the copolymer per 100 parts by weight of the liquid epoxy resin (A) because a further stress reduction and better adhesion are expectable.

For the purpose of further reducing stress, silicone rubber, silicone oil, liquid polybutadiene rubber, a thermoplastic resin of methyl methacrylate-butadiene-styrene or the like may be compounded in the inventive composition insofar as the benefits of the invention are not compromised.

If necessary, the liquid epoxy resin composition may contain also other additives as long as they do not compromise the objects of the invention. Suitable additives include carbon-functional silanes for improving adhesion, pigments (e.g., carbon black), dyes, antioxidants, and surface treating agents (e.g., γ-glycidoxypropyltrimethoxy-silane).

The liquid epoxy resin composition of the invention may be prepared by the simultaneous or discrete stirring, melting, mixing or dispersion of the epoxy resin, curing agent, curing accelerator, inorganic filler and modified silicone resin as well as optional components, while heating if necessary. No particular limitation is imposed on the apparatus used for mixing, stirring, dispersing and otherwise processing the mixture of components. Exemplary apparatus suitable for this purpose include an automated mortar, three-roll mill, ball mill and planetary mixer which is equipped with an agitator and a heater. Use can also be made of suitable combinations of these apparatuses.

In molding the liquid epoxy resin composition of the invention, a conventional molding method may be used under well-known conditions. Preferably curing is carried out in a hot oven at 150° C. for 1.0 hour or longer. A temperature below 150° C. or a time of less than 1.0 hour may be insufficient to achieve satisfactory cured properties.

When the liquid epoxy resin composition of the invention is cured as above, the cured product should have a glass transition temperature (Tg) of 30 to 120° C. and a ratio of a dynamic viscoelasticity X at 30° C. or lower (especially 0 to 30° C.) to a dynamic viscoelasticity Y at 150° C. or higher (especially 150 to 280° C.), that is, X/Y of at least 100, preferably from 100 to 1,000, and more preferably from 200 to 800. Preferably the composition has a viscosity of less than about 10,000 poises at 25° C., more preferably about 10 to 5,000 poises at 25° C.

The specific Tg and dynamic viscoelasticity ratio (X/Y) are arrived at by selecting the epoxy resin and curing agent (especially phenolic resin) and properly determining their blending amounts.

The semiconductor devices to be sealed with the inventive composition are typically flip chip-type semiconductor devices. Referring to FIG. 1, the flip chip-type semiconductor device includes an organic substrate 1 having an interconnect pattern side on which is mounted a semiconductor chip 3 over a plurality of intervening bumps 2. The gap between the organic substrate 1 and the semiconductor chip 3 (shown in the diagram as gaps between the bumps 2) is filled with an underfill material 4, and the lateral edges of the gap and the periphery of semiconductor chip 3 are sealed with a fillet material 5. The inventive liquid epoxy resin composition is especially suitable in forming the underfill. When the inventive composition is used as an underfill material, the cured product preferably has an expansion coefficient of 20 to 40 ppm/° C. below the Tg.

Sealant used as the fillet material may be a conventional material known to the art. The use as the fillet of a liquid epoxy resin composition of the same type as the present invention is especially preferred. The cured product in this case preferably has an expansion coefficient of 10 to 20 ppm/° C. below the Tg.

EXAMPLE

Examples of the invention and comparative examples are given below by way of illustration, and are not intended to limit the invention.

Examples 1–5 and Comparative Examples 1–3

The components shown in Table 1 were blended to uniformity on a three-roll mill to give eight liquid epoxy resin compositions. These liquid epoxy resin compositions were examined by the following tests. The results are also shown in Table 1.

Viscosity

The viscosity at 25° C. was measured using a BH-type rotary viscometer at a rotational speed of 4 rpm.

Gelation Time

The gelation time for the composition was measured on a hot plate at 150° C.

Glass Transition Temperature (Tg)

Using a sample of the cured composition measuring 5×5×15 mm, the glass transition temperature was measured with a thermomechanical analyzer at a heating rate of 5° C./min.

Coefficients of Thermal Expansion (CTE)

Based on the Tg measurement described above, a coefficient of thermal expansion in a certain temperature range was determined. When Tg was in the range of 30 to 100° C., the coefficient of thermal expansion below the Tg (CTE-1) was determined for a temperature range of −30 to 0° C., and the coefficient of thermal expansion above the Tg (CTE-2) was determined for a temperature range of 150 to 180° C. When Tg was above 100° C., CTE-1 was determined for a temperature range of 50 to 80° C., and CTE-2 was determined for a temperature range of 200 to 230° C.

Elasticity Ratio

Using DMA (DMS-120) by Seiko Co., Ltd., the cured composition was measured for modulus of elasticity both at 30° C. and 200° C. The modulus of elasticity at 30° C. divided by the modulus of elasticity at 200° C. is an elasticity ratio.

Warpage

A polyimide-coated 10×10 mm silicon chip was stacked on a 30×30 mm FR-4 substrate using spacers of approximately 100 μm thick, leaving a gap therebetween. An epoxy resin composition was introduced into the gap and cured for 4 hours at 150° C. The diagonal warpage of the chip was measured by a warpage meter.

PCT Delamination Test

A polyimide-coated 10×10 mm silicon chip was stacked on a 30×30 mm FR-4 substrate using spacers of approximately 100 μm thick, leaving a gap therebetween. An epoxy resin composition was introduced into the gap and cured for 4 hours at 150° C. The assembly was then placed in a pressure cooker test (PCT) environment of 121° C. and 2.1 atm for 168 hours. At the end of the test, the assembly was checked for delamination by C-SAM (by SONIX Co., Ltd.).

Thermal Shock Test

A polyimide-coated 10×10 mm silicon chip was stacked on a 30×30 mm FR-4 substrate using spacers of approximately 100 μm thick, leaving a gap therebetween. An epoxy resin composition was introduced into the gap and cured for 4 hours at 150° C. The assembly was then tested by thermal cycling between −65° C./30 minutes and 150° C./30 minutes. After 250, 500 and 750 cycles, the assembly was examined for peeling and cracks.

TABLE 1

|  |  | Example | | | Comparative Example | | |
| --- | --- | --- | --- | --- | --- | --- | --- |
|  |  | 1 | 2 | 3 | 1 | 2 | 3 |
| Component (pbw) | | | | | | | |
| RE303SL | | 50 | 25 | 47 | 47 | 45 | 40 |
| MH700 | | | | | | 55 | 55 |
| KBM403 | | 1.0 | 1.0 | 1.0 | | 1.0 | 1.0 |
| Copolymer | | 5 | 5 | 3 | | | 5 |
| Microcapsule of 2E4MZ | | 5 | 5 | 5 | 5 | 5 | 5 |
| Epoxy resin A | | | 20 | | | | |
| Curing agent A | | 45 | 45 | 39 | 45 | | |
| Curing agent B | | | | 5 | | | |
| SE8FC | | 120 | 120 | 120 | 120 | 120 | 120 |
| Measurement results | | | | | | | |
| Viscosity at 25° C. (Pa · s) | | 100 | 85 | 220 | 76 | 12 | 18 |
| Gelation time at 150° C. (s) | | 80 | 78 | 90 | 75 | 75 | 77 |
| Tg (° C.) | | 60 | 82 | 70 | 64 | 144 | 140 |
| CTE-1 (ppm/° C.) | | 34 | 35 | 32 | 45 | 40 | 41 |
| CTE-2 (ppm/° C.) | | 110 | 120 | 115 | 135 | 125 | 129 |
| Elasticity ratio 30° C./200° C. | | 480 | 230 | 240 | 780 | 40 | 50 |
| Warpage | | 10 | 15 | 16 | 12 | 39 | 38 |
| PCT delamination test | | no delamination | no delamination | no delamination | no delamination | delaminated | delaminated |
| Failure (%) | 250 cycles | 0 | 0 | 0 | 30 | 15 | 0 |
| after thermal | 500 cycles | 0 | 0 | 0 | 100 | 60 | 0 |
| shock test | 750 cycles | 0 | 0 | 0 | — | 100 | 50 |

Components

RE303SL: bisphenol F-type epoxy resin (Nippon Kayaku Co., Ltd.)

MH700: methyltetrahydrophthalic anhydride (New Japan Chemical Co., Ltd.)

KBM403: silane coupling agent (Shin-Etsu Chemical Co., Ltd.)

Copolymer: the addition reaction product of

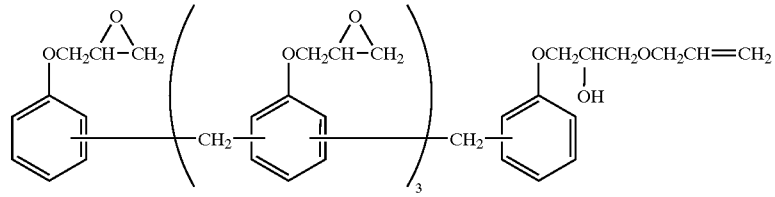

and

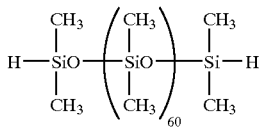

Microcapsules of 2E4MZ: A methyl methacrylate polymer which contains 20 wt % of 2E4MZ (2-ethyl-4-methylimidazole). Average particle size, 7 μm. Amount of cure accelerating catalyst which dissolves from microcapsules during 15 minutes of treatment in o-cresol at 30° C., 87 wt %. Epoxy resin A: MRGE (Nippon Kayaku Co., Ltd.), viscosity 0.7 Pa·s (25° C.), epoxy equivalent 130 Curing agent A: DAL-BPA (Honshu Chemical Industry Co., Ltd.), viscosity 16 Pa·s (25° C.), hydroxyl equivalent 154 Curing agent B: DL92 (Meiwa Chemicals Co., Ltd.), solid at room temperature, hydroxyl equivalent 107 SE8FC: spherical silica having an average particle size of 8 μm and a maximum particle size of up to 24 μm (Tatsumori Co., Ltd.)

There has been described a liquid epoxy resin composition which cures into a cured product having improved adhesion to the surface of silicon chips and especially to photosensitive polyimide resins and nitride films, good heat resistance and thermal shock resistance, and reduced internal stresses which cause minimized warpage to semiconductor devices sealed therewith, and is thus best suited as a sealant for semiconductor devices having large size dies or substrates. These characteristics confer a very high reliability to semiconductor devices sealed with the inventive epoxy resin composition.

Japanese Patent Application No. 2001-247314 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A liquid epoxy resin composition comprising
(A) a liquid epoxy resin including 25 to 100% by weight of a resin of the following general formula (2):

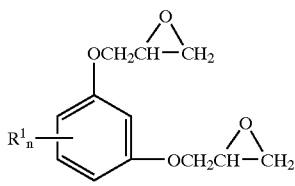

wherein $R^1$ is hydrogen or a monovalent hydrocarbon group of 1 to 20 carbon atoms and n is an integer of 1 to 4,
(B) a curing agent,
(C) a curing accelerator,
(D) an inorganic filler, and
(E) a silicone-modified resin in the form of a copolymer of an alkenyl-containing epoxy resin or alkenyl-containing phenolic resin with an organopolysiloxane of the general average compositional formula (1)

$$H_aR_bSiO_{(4-a-b)/2} \quad (1)$$

wherein R is a substituted or unsubstituted monovalent hydrocarbon group, "a" is a number of 0.01 to 0.1, "b" is a number of 1.8 to 2.2, and a+b is from 1.81 to 2.3, having 20 to 400 silicon atoms per molecule, the number of hydrogen atoms directly bonded to silicon atoms (SiH groups) being 1 to 5, the copolymer resulting from addition reaction of alkenyl groups on the epoxy or phenolic resin with SiH groups on the organopolysiloxane,
said liquid epoxy resin composition curing into a product having a glass transition temperature of 30 to 120° C. and a ratio of a dynamic viscoelasticity at 30° C. or lower to a dynamic viscoelasticity at 150° C. or higher of at least 100.

2. The composition off claim 1 wherein the curing agent (B) includes 25 to 100% by weight of a resin of the following general formula (3):

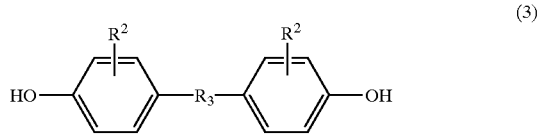

wherein $R^2$ is a monovalent hydrocarbon group of up to 10 carbon atoms having a double bond, and $R^2$ is selected from divalent hydrocarbon groups of the following formulae:

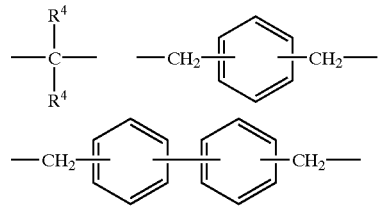

wherein $R^4$ is hydrogen or a monovalent hydrocarbon group of up to 10 carbon atoms.

3. The composition of claim 1 wherein the curing accelerator (C) is an imidazole compound or organophosphorus compound.

4. The composition of claim 1 wherein the curing accelerator (C) is comprised of microcapsules containing an imidazole compound or organophosphorus compound therein and having an average particle size of 0.5 to 10 μm, the quantity of the imidazole compound or organophosphorus compound leached out from the microcapsules in o-cresol at 30° C. for 15 minutes being at least 70% by weight of the entire compound quantity in the microcapsules.

5. A semiconductor device which is sealed with the liquid epoxy resin composition of claim 1 in the cured state.

6. A flip chip type semiconductor device which is sealed with the liquid epoxy resin composition of claim 1 in the cured state.

7. The composition of claim 1 wherein the epoxy resin comprises from about 25 to about 100 percent by weight of the composition.

8. The composition of claim 1 wherein the epoxy resin has a total chlorine content of not more than 1,500 ppm.

9. The composition of claim 1 wherein the inorganic filler is selected from the group consisting of: fused silica, crystalline silica, aluminum, alumina, aluminum nitride, boron nitride, silicon nitride, magnesia and magnesium silicate.

10. The composition of claim 1 wherein the inorganic filler has a maximum particle size of 75 μm.

11. The composition of claim 1 wherein the amount of the filler included in the composition is in a range of 100 to 600 parts by weight per 100 parts by weight of the combined weight of the liquid epoxy resin (A), plus the curing agent (B) and the modified silicone resin (E).

* * * * *